United States Patent [19]
Davis et al.

[11] Patent Number: 6,155,311
[45] Date of Patent: *Dec. 5, 2000

[54] LEAD CONDITIONING SYSTEM

[75] Inventors: Shawn Ross Davis; James E. Maksim; Wilfrido Villanueva Lapus, all of Santa Clara, Calif.

[73] Assignee: Precision Technologies, Inc., Santa Clara, Calif.

[*] Notice: This patent is subject to a terminal disclaimer.

[21] Appl. No.: 09/222,066

[22] Filed: Dec. 29, 1998

Related U.S. Application Data

[63] Continuation-in-part of application No. 08/886,775, Jul. 1, 1997, Pat. No. 5,862,838.

[51] Int. Cl.[7] .................................................. B21F 45/00
[52] U.S. Cl. ............................................................ 140/147
[58] Field of Search ................................ 140/105, 147

[56] References Cited

U.S. PATENT DOCUMENTS

| | | | |
|---|---|---|---|
| 2,988,127 | 6/1961 | Gray | 72/20.1 |
| 3,687,172 | 8/1972 | Suverkropp | 140/147 |
| 3,796,201 | 3/1974 | Golub | 140/1 |
| 3,880,205 | 4/1975 | Linker et al. | 140/147 |
| 3,903,934 | 9/1975 | Vizy | 140/105 |
| 4,103,718 | 8/1978 | Steigerwald | 140/105 |
| 4,481,984 | 11/1984 | Linker | 140/147 |
| 4,705,081 | 11/1987 | Birk et al. | 140/147 |
| 4,727,912 | 3/1988 | Gonzalez | 140/147 |
| 4,765,376 | 8/1988 | Leiwe | 140/147 |
| 4,818,210 | 4/1989 | Van Dijk et al. | 425/411 |
| 5,105,857 | 4/1992 | Ellis | 140/105 |
| 5,113,916 | 5/1992 | Linker, Jr. | 140/147 |
| 5,222,528 | 6/1993 | Downing | 140/105 |
| 5,273,081 | 12/1993 | Maksim | 140/105 |
| 5,301,720 | 4/1994 | Plummer, Jr. et al. | 140/147 |
| 5,319,847 | 6/1994 | Darling et al. | 29/827 |
| 5,487,416 | 1/1996 | Maksim | 140/105 |
| 5,777,886 | 7/1998 | Glucksman et al. | 140/105 |
| 5,862,838 | 1/1999 | Davis et al. | 140/105 |

FOREIGN PATENT DOCUMENTS

| | | | |
|---|---|---|---|
| 62-81234 | 4/1987 | Japan | 140/147 |
| 1-157717 | 6/1989 | Japan . | |

*Primary Examiner*—Lowell A. Larson
*Attorney, Agent, or Firm*—Flehr Hohbach Test Albritton & Herbert LLP

[57] ABSTRACT

A system for conditioning the leads of a semiconductor device. The system includes a base having anvil surfaces configured to form the leads to a predetermined shape, and forming arms mounted to the base. An actuator is movable relative to the base to move the forming arms from a first position, with the forming arm spaced from the leads, to a second position, with the forming arm urging the leads against the anvil surface to form the leads to a predetermined configuration. Adjustment means adjust the position of said anvil and arms. A video scanner scans sample semiconductor devices and generates lead dimension and configuration signals. A processor processes said signals and applies the processed signals to the adjustment means to form leads of a semiconductor device to predetermined dimensions and configuration.

3 Claims, 14 Drawing Sheets

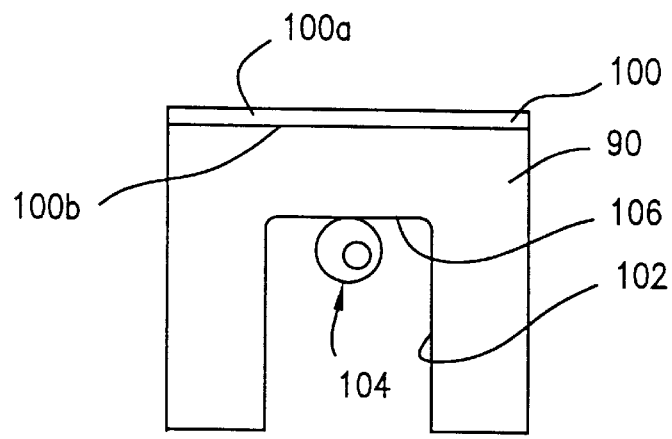
FIG. 10
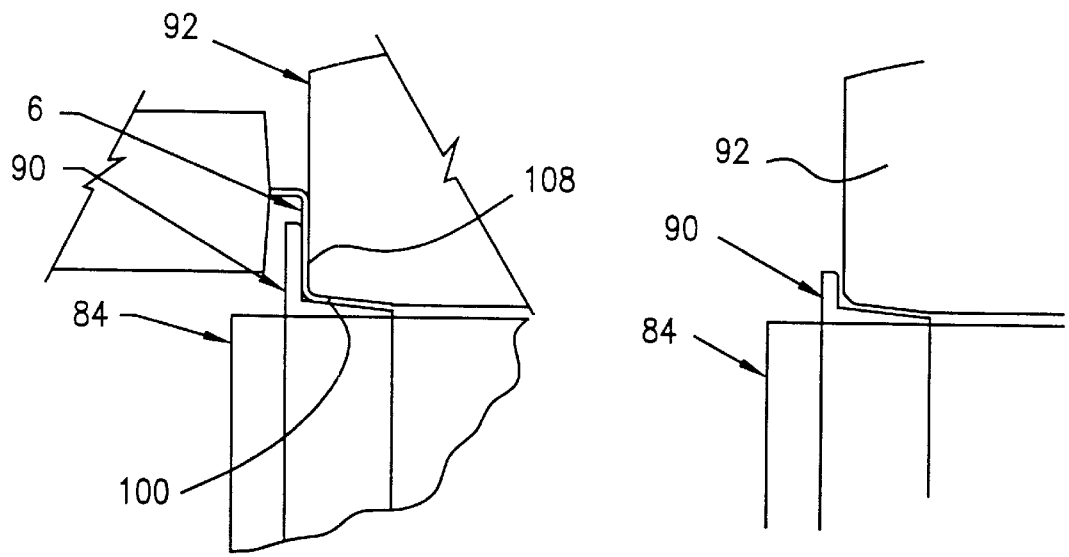
FIG. 11
FIG. 12

LEAD CONDITIONING SYSTEM

This application is a continuation-in-part of U.S. application Ser. No. 08/886,775 filed Jul. 1, 1997, now U.S. Pat. No. 5,862,838.

BRIEF DESCRIPTION OF THE INVENTION

The present invention relates in general to a system for conditioning the leads of a semiconductor device. More particularly, the present invention relates to a system for reforming the leads of a semiconductor device of the type having parallel leads shaped in a predetermined configuration.

BACKGROUND OF THE INVENTION

Semiconductor devices are typically packaged within a molded body for protection against the corrosive elements of the environment. With one type of package, the semiconductor device is coupled to an associated circuit by a plurality of parallel conductors or leads which project from the molded body. The parallel leads typically are positioned on two or four sides of the molded package. The leads are constructed from a pliable metal which can be easily formed into a desired configuration without damaging either the semiconductor chip or the molded body. However, the application of even a small amount of pressure may bend the leads away from the desired shape and position. The deformed leads of a semiconductor device may be pressed close together, removing the pre-formed parallelism, or bent vertically relative to the molded body so that they do not lie on a common plane. Pre-formed bends in the lead connectors may be distorted. The lead conductors on opposing ends of the molded body may be bent, distorting the tweeze or tip-to-tip distance of the device. Once out of position, the leads may not match with the pads on the associated circuit board and the semiconductor package will be considered to be defective. Even when considerable care is taken while handling the packaged semiconductor device, the leads of a large number of semiconductor devices may be bent away from the predetermined configuration.

One method of mounting a semiconductor device to a circuit board is accomplished by positioning the device on the board by hand and then manually soldering it in place. Another application method is to use an automatic placement machine to set the device on the circuit board, and then apply heat to the board to melt the solder paste beneath the leads. For the automatic placement method, leads which are out of shape and/or position may not rest on a spot of solder paste such that no connection is made with the associated circuit.

Methods exist in the art for salvaging some of the defective semiconductor devices by straightening the bent leads. The bent lead conductors can be reformed by manually bending each lead back to the appropriate configuration. However, this process is extremely time consuming and subject to human error. If the leads are not severely deformed, they may be reformed by spanking the semiconductor device or compressing the leads between opposing dies. However, compressing the lead conductors will not reintroduce parallelism between the leads. U.S. Pat. No. 4,727,912 shows a device in which one of the dies is formed with teeth. Although this device may reintroduce parallelism between some of the less deformed leads, other leads may be damaged by the teeth on the dies. A system for reconditioning bent leads into a parallel and predetermined shape is desirable.

Another method for conditioning the deformed leads uses opposing blades to straighten and massage the leads as the semiconductor device passes along a track, as is disclosed in U.S. Pat. No. 4,481,984. Reforming the leads using these opposing blades may not be effective for severely bent leads. Moreover, the system may only be used with packages having leads positioned on two opposite sides of the device. A system which may be used to efficiently recondition leads projecting from four sides of a semiconductor device is desirable.

U.S. Pat. Nos. 5,273,081 and 5,487,416 disclose multistage conditioning systems in which the leads are massaged at a first station to reintroduce parallelism and then moved to a second station where dies form the leads to remove elastic memory from the leads. The third station reforms the leads to the predetermined configuration.

The actual dimensions of the molded package vary from manufacturer to manufacturer. Because of the precision required to reform the leads to the exact predetermined configuration, dimensional variations may impair the ability of a conditioning system to simultaneously reform all of the leads. Prior to conditioning the leads, a sample package from each batch must be carefully measured and adjustments made to the conditioning system to accommodate the size variations. These adjustments typically require partially dismantling and then reassembling the machinery. A lead conditioning system in which the leads are scanned and the conditioning system is automatically adjusted to accommodate different semiconductor packages as well as different lead configurations is desirable.

OBJECTS AND SUMMARY OF THE INVENTION

It is a primary object of the present invention to provide a system for reintroducing parallelism and a predetermined configuration to bent leads.

A further object of the present invention is to provide a system for conditioning the leads of semiconductor devices having different dimensions.

Another object of the present invention is to simultaneously form the leads projecting from opposite sides of the semiconductor device.

A more general object of the present invention is to provide a system which conveniently, efficiently and reliably forms deformed and misaligned leads, and to provide a lead conditioning system which scans the semiconductor devices and automatically adjusts the system components to accommodate the semiconductor device.

In summary, the present invention is particularly suitable for conditioning and reforming the bent leads of a semiconductor device of the type having parallel leads projecting from the body in a predetermined configuration. The lead conditioning apparatus of the present invention includes a lead conditioning apparatus having a base for retaining the body of the semiconductor device, at least one anvil surface configured to form the leads to a predetermined shape, and at least one forming arm mounted to the base. The forming arm is pivotal between a first position with the forming arm spaced from the leads and a second position with the forming arm urging the leads against the anvil surface to form the leads to the predetermined shape. In one aspect of the invention, the apparatus includes one or more lead forming assemblies each including at least one anvil surface and at least one forming arm for urging the leads against the anvil surface. The leads stand on the anvil surface to support the semiconductor body during processing. In another aspect of the invention, the forming arm and/or anvil surface may be automatically moved in response to a device scanner to adjust the position of the forming arm and/or anvil surface relative to the leads of the semiconductor device. The apparatus also includes an actuator which may be moved relative to the base to engage the forming arm and move the forming arm from the first position to the second position to urge the leads against the anvil surface and form the leads to the predetermined configuration.

The invention also includes the method of conditioning the leads of a semiconductor device. The method includes the steps of forming the leads by bringing the leads of the semiconductor device into parallelism, moving an actuator toward the semiconductor device and engaging at least one forming arm to move the forming arm toward the leads of the semiconductor device until the leads are urged against an anvil surface, and moving the actuator away from the semiconductor device to release the leads from the forming arm.

Additional objects and features of the invention will be more readily apparent from the following detailed description and appended claims when taken in conjunction with the drawings.

BRIEF DESCRIPTION OF THE DRAWINGS

FIG. 10 is a front plan view of the anvil and cam of FIG. 6.

FIG. 11 is an enlarged view similar to FIG. 9 with the anvil surface in a second position.

FIG. 12 is an enlarged view similar to FIG. 9, with the semiconductor device removed from the forming station.

DETAILED DESCRIPTION OF THE INVENTION

Reference will now be made in detail to the preferred embodiment of the invention, which is illustrated in the accompanying figures. Turning now to the drawings, wherein like components are designated by like reference numbers throughout the various figures, attention is directed to FIGS. 1 and 2.

Figure 9:
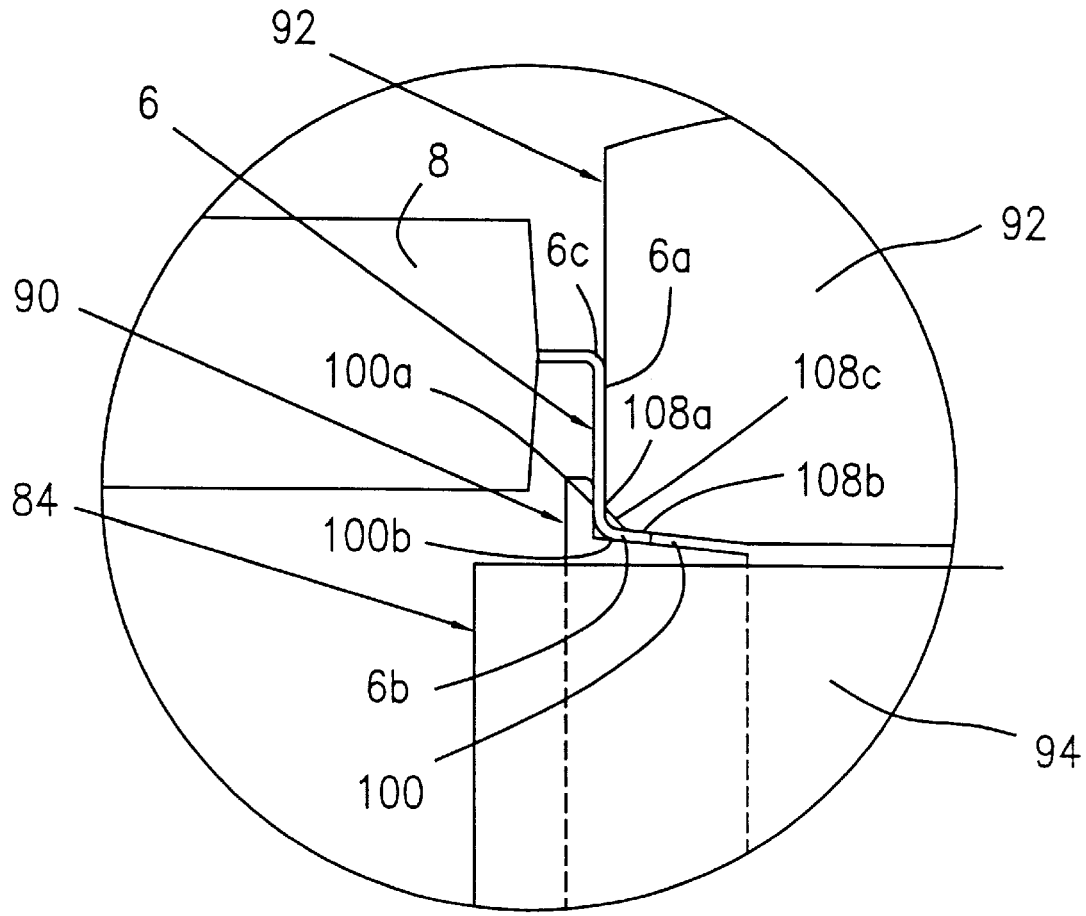
FIG. 9 is an enlarged view of forming station within line 9—9 of FIG. 7.
Figure 9A:
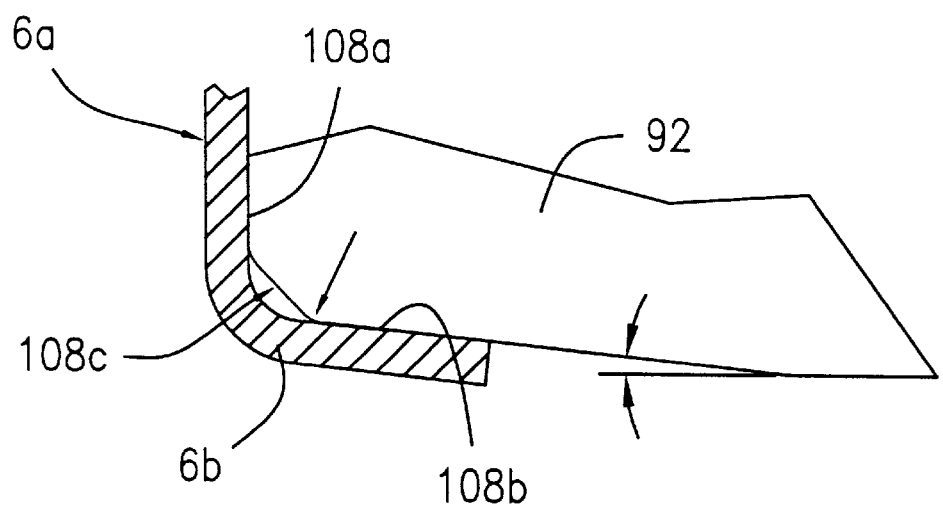
FIG. 9A is an enlarged view of the forming surface of FIG. 9.

Lead conditioning system 10, construction in accordance with the present invention, is particularly suitable for conditioning the bent or misaligned leads 6 of a semiconductor device 8, FIGS. 9 and 9a. Lead conditioning system 10 generally includes an engaging and massaging station 12 for returning the misaligned leads to a parallel condition and lead forming stations 14. In the embodiment shown in FIG. 1, the lead conditioning system 10 includes two lead forming stations 14a and 14b. However, as is discussed below, the number of lead forming stations may be increased or decreased in accordance with this invention. Semiconductor devices 8 are transported from a starting point 16 to a finish point 18 by a part handling shuttle (not shown) or other automated transfer system or by hand. A control system (not shown) controls the operating and timing of the lead conditioning system 10.

In the illustrated embodiment of the invention, the system 10 also includes a calibration station 24 (FIG. 13) for measuring sample semiconductor devices and determining the amount of adjustment, if any, required to prepare the system 10 for processing a particular batch of semiconductor devices. In this embodiment, the user manually operates the calibration station and inputs the results into the control system, which then automatically adjusts the stations 12 and 14. However, it is to be understood that the calibration station may be coupled to the control system, with the control system controlling operation of the calibration system and adjustment of the stations 12 and 14 in accordance with the measured results. Alternatively, the calibration station may include a high speed 3D digital camera which grabs an image or picture of the semiconductor device. The image is then processed and stations 12 and 14 adjusted to process the particular semiconductor device. A detailed description of an image processing and station adjustment system is provided with respect to FIG. 17.

Figure 3:
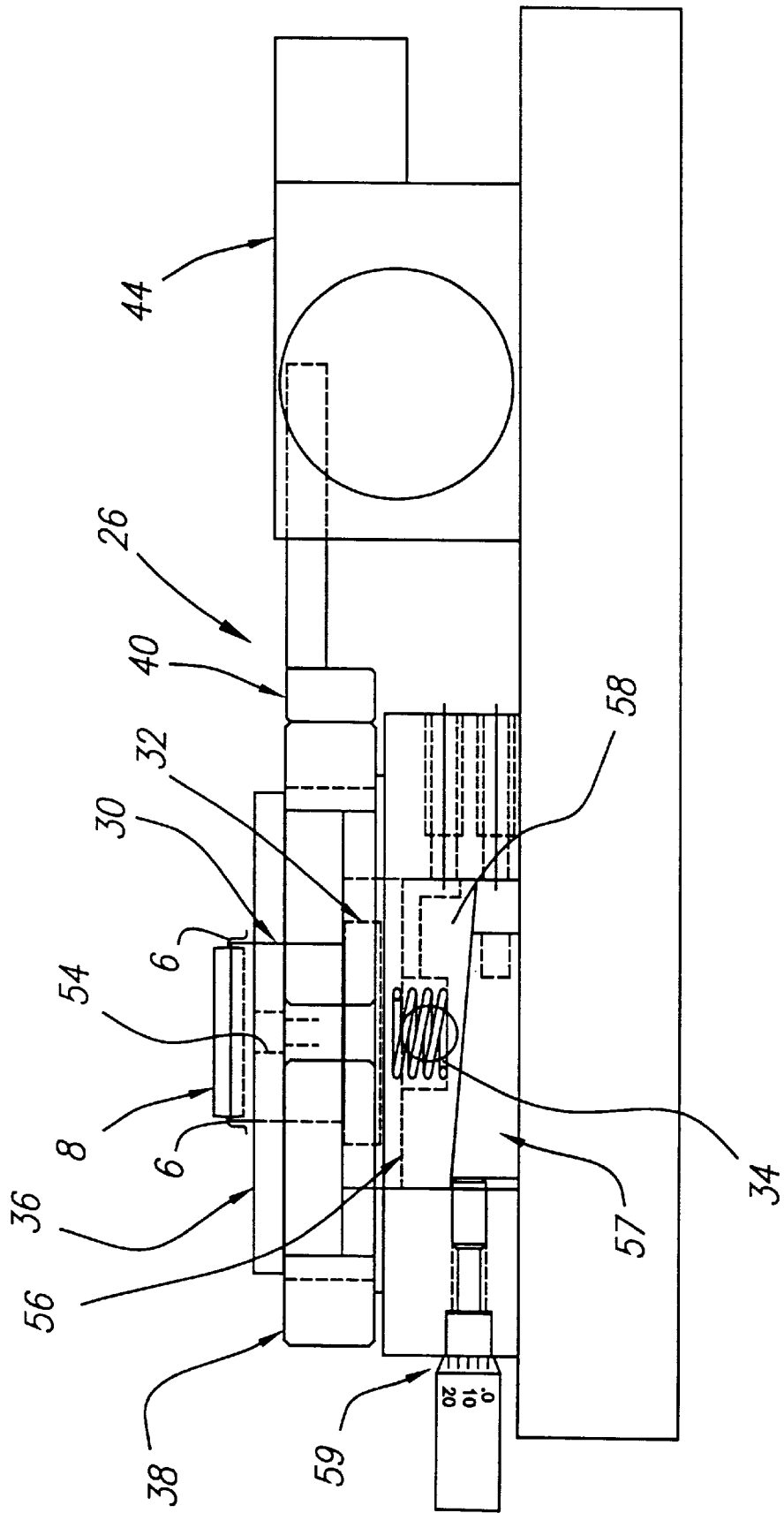
FIG. 3 is a front plan view, partially broken away, of the lower die of the engaging and massaging station of FIG. 1, shown supporting a semiconductor device.
Figure 4:
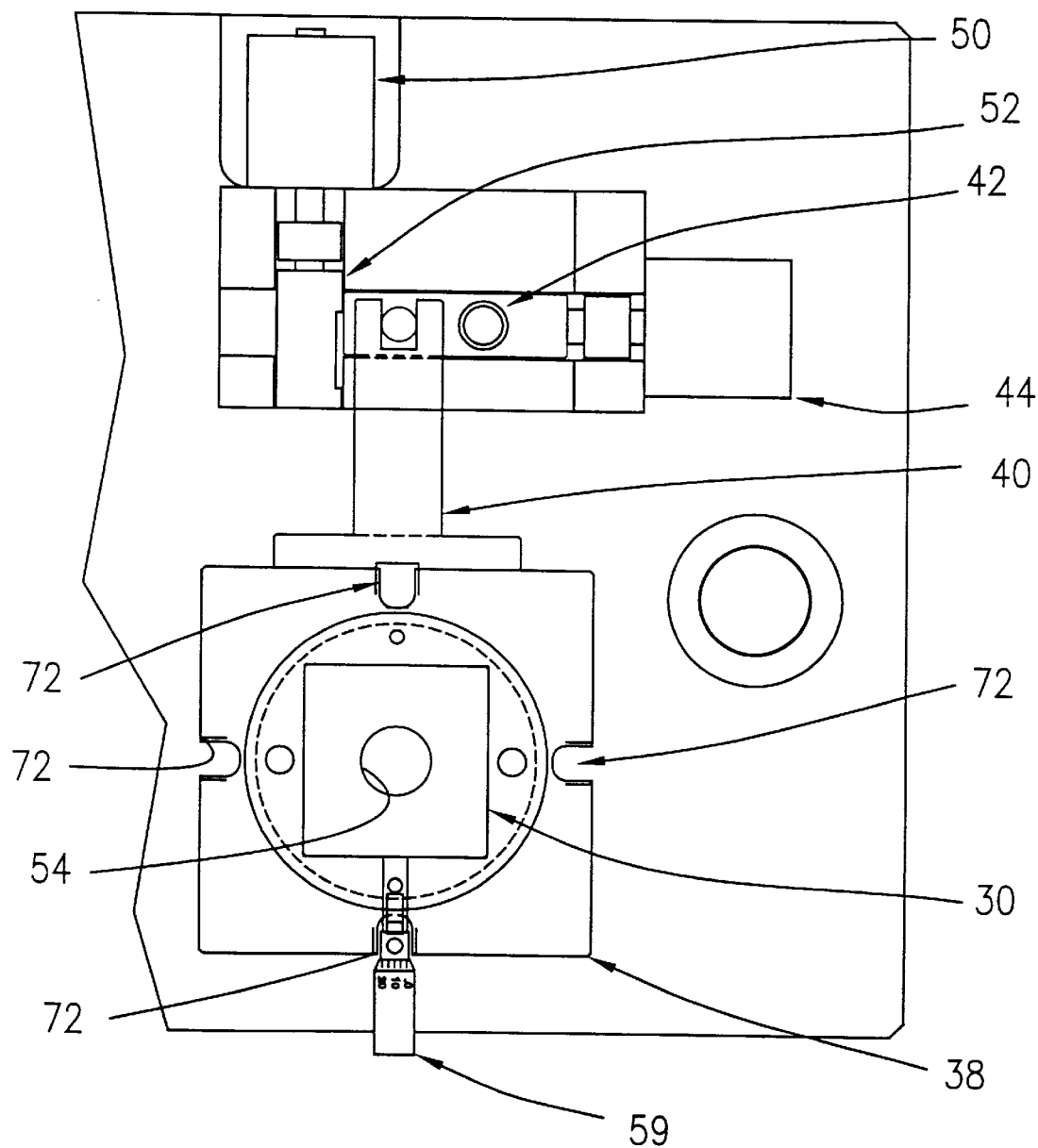
FIG. 4 is a top plan view of the lower die of FIG. 3.
Figure 5:
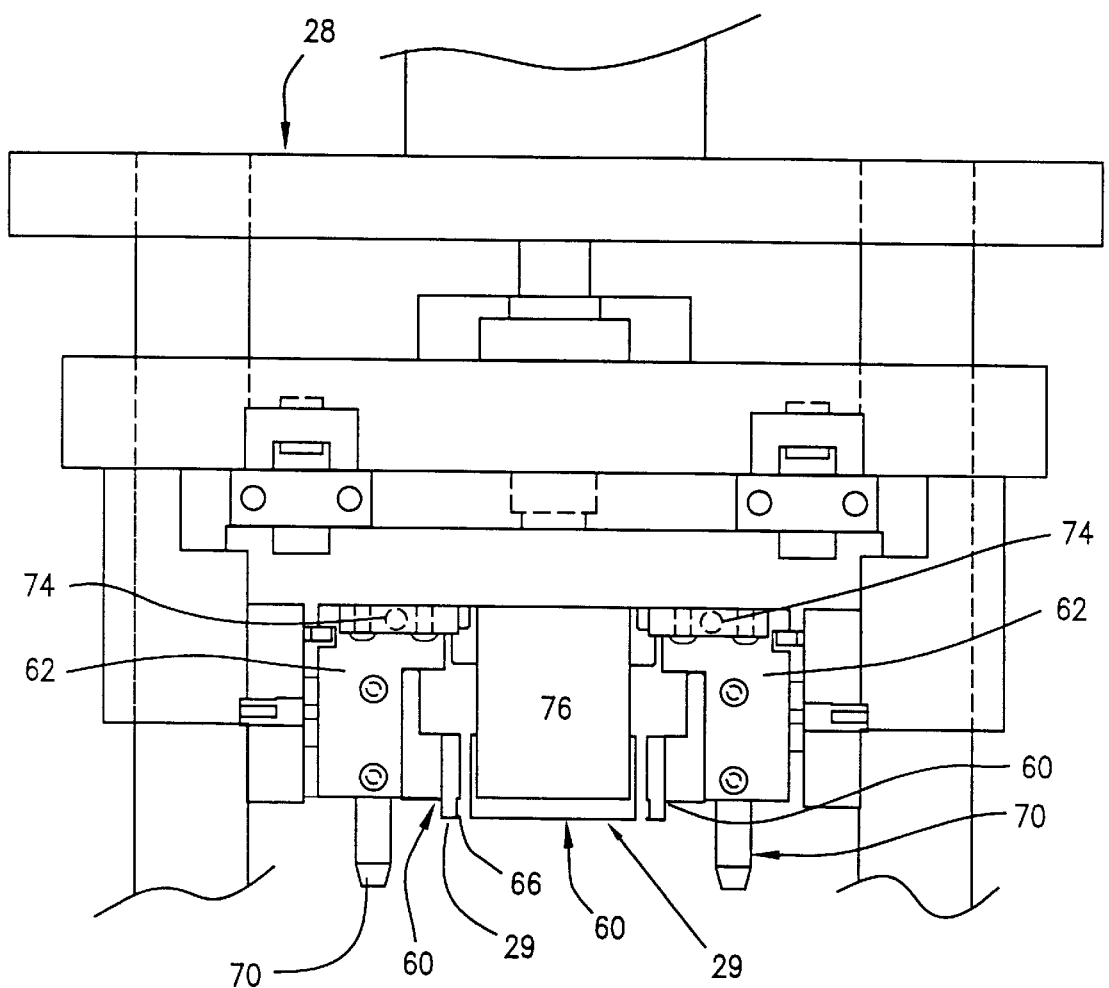
FIG. 5 is a front plan view, partially broken away, of the upper die of the engaging and massaging station of FIG. 1.

Turning to FIGS. 3–5, the engaging and massaging station 12 is described in greater detail. Engaging and massaging station 12 is of the type disclosed in U.S. Pat. Nos. 5,273,081 and 5,487,416, the disclosures of which are incorporated herein by reference. The engaging and massaging station includes a lower die 26 which supports the semiconductor device 8 and positions the leads 6 to facilitate the introduction of parallelism to the leads and an upper die 28 which includes one or more combs 29 shaped to engage and realign the leads when the upper die 28 is closed onto the lower die 26.

The lower die 26, shown particularly in FIGS. 3 and 4, includes a package nest or support 30 which supports the body of the semiconductor device with the leads 6 projecting outwardly from the support. The package nest 30 is carried by an elevator block 32 which is supported by spring 34. The package nest extends through, and is substantially surrounded by, a lead sweep plate 36. When the upper die 28 is moved to the lower die 26, the elevator block 32 is lowered, compressing spring 34, and the lead sweep plate 36 bends the leads upward relative to the molded body of the semiconductor device. Bending the leads upward relative to molded body 32 substantially removes elastic memory of the pressed together condition, facilitates the return of the leads to a substantially parallel configuration projecting from the molded body of the device, and allows the leads to be moved to a substantially coplanar configuration.

A pivot plate 38 surrounds, but does not support, the lead sweep plate 36. The pivot plate 38 controls the movement of the combs 29, and is free to rotate relative to the lead sweep plate. In the illustrated embodiment, pivot plate 38 is coupled to a pivot arm 40. The distal end of the pivot arm 40 is manipulated relative to a stop 42 by an air cylinder 44 to pivot the pivot plate 38 relative to the lead sweep plate 36. The range of movement of the pivot arm 40 may be adjusted by increasing or decreasing the size of the stop 42. In the embodiment of the invention illustrated in FIGS. 3–5, the pivot plate may be centered prior to operation of the engaging and massaging station 12 by activating a centering cylinder 50 to cause the intermittent centering stop 52 to stop the pivot arm and center the pivot plate relative to the lead sweep plate. The operation of the centering cylinder 50 is controlled by the microprocessor.

The package nest includes means for sensing the positioning of the semiconductor device, such as vacuum sensor 54 in the elevator block which is connected to the surrounding environment through air access opening in package nest 30. When the semiconductor device is accurately placed in the package nest, the molded body blocks the opening, creating a vacuum and triggering the vacuum sensor. The microprocessor receives the signal and initiates operation of the engaging and massaging station 12. If the semiconductor device is improperly positioned on the package nest, the molded body will not completely cover the opening and no vacuum will be created. The engaging and massaging station will not operate until the semiconductor device has been properly placed, preventing any damage during the lead conditioning process. Since no vacuum is created signaling the start of operation, a misplaced part will not be damaged in engaging and massaging station 12.

In accordance with the present invention, the height of the package nest 30 may be raised or lowered relative to the lead sweep plate 36 to adjust the height of the package nest 30 and therefore the elevation of the semiconductor body relative to the lead sweep plate. By moving the package nest 30 relative to the lead sweep plate 36, the amount by which the leads are urged upwardly relative to the device body may be adjusted. For many semiconductor devices 8, moving the leads by 2 mm to 3 mm may be sufficient to successfully reform the leads to the parallel and coplanar configurations. Variations in the height of the molded body of the device 8 and/or the height of the leads may also be accommodated by adjusting the elevation of the package nest. As is shown particularly in FIG. 3, the spring 34 supporting the elevator block 32 is positioned on an adjustable base 56 including a pair of cooperating wedge-shaped blocks 57 and 58. The lateral position of the lower block 57 may be adjusted relative to the upper block 58 by activating an actuator 59. In this embodiment, the actuator 59 is a manually adjustable micrometer, although it is to be understood that the actuator 59 may be provided by other manual devices. Instead of being manually adjustable, the actuator 59 may be an automatic device, such as a servo motor, which is coupled to the control system so that the position of the lower block 57 may be adjusted automatically.

The upper surface of the upper block 58 defines a stop limiting downward movement of the package nest 30 when the package nest is lowered during operation of the engaging and massaging station 12. As the lower block 57 is moved laterally relative to the upper block, the slanted upper surface of the lower block 57 slides along the slanted lower surface of the upper block 58, thereby raising or lowering the upper block 58. Adjusting the vertical position of the upper block 58 raises and lowers the spring 34 as well as the limiting stop provided by the upper block 58. By activating the actuator 59, the height of the package nest 30 relative to the lead sweep plate during operation of the engaging and massaging station 12 may be conveniently adjusted without significantly interrupting the operation of the station.

As is shown particularly in FIG. 5, upper die 28 includes at least one, and preferably four, comb assemblies 60, although it is to be understood that including a different number of the comb assemblies in engaging and massaging station 12 is within the scope of the present invention. Each comb assembly 60 includes at least one comb 29 mounted to comb mounting block 62. To provide the strength and dimensions required for massaging the leads, the comb is formed with a plurality of teeth 66. In this embodiment of the invention, the teeth of the combs 29 are inserted between the adjacent leads and positioned to massage the leads when the upper die 28 is lowered onto the lower die 26. Alternatively, the comb assemblies may be moved through the leads from the base toward the tip prior to massaging the leads as is disclosed in U.S. Pat. Nos. 5,273,081 and 5,487,416. Stationary alignment pins 70 mounted to the upper die 28 engage alignment slots 72 (FIG. 4) formed in the pivot plate 38 when the upper die 28 is lowered onto the lower die 26. Spring plungers 74 positioned on either side of the comb mounting block 62 allow for the oscillation of the comb in a direction perpendicular to the movement of the slide cylinder.

When the upper die is lowered to a closed position, a pressure pin 76 carried by the upper die pushes on the molded body of the semiconductor device, lowering elevator block 32 and compressing spring 34. The lead sweep plate forces the leads upward relative to body of the semiconductor device. Alignment pins 70 are inserted into alignment slots 72, while combs 29 are inserted between the leads at a massaging position vicinal the lead tips. The engagement between the alignment pins and alignment slots couples the comb mounting block 62 to the pivot plate 38, causing the comb mounting block to move with the pivot plate 38 to move the combs 29 in a direction substantially perpendicular to leads. Thus, as the pivot plate is pivoted relative to the package nest 30, the combs 29 massage the leads by bending them to either side of body of the semiconductor device. Bending the leads to either side of the device body and then returning the leads to a zero position substantially re-introduces the predetermined amount of spacing between the leads and brings the leads into parallelism.

Figure 1:
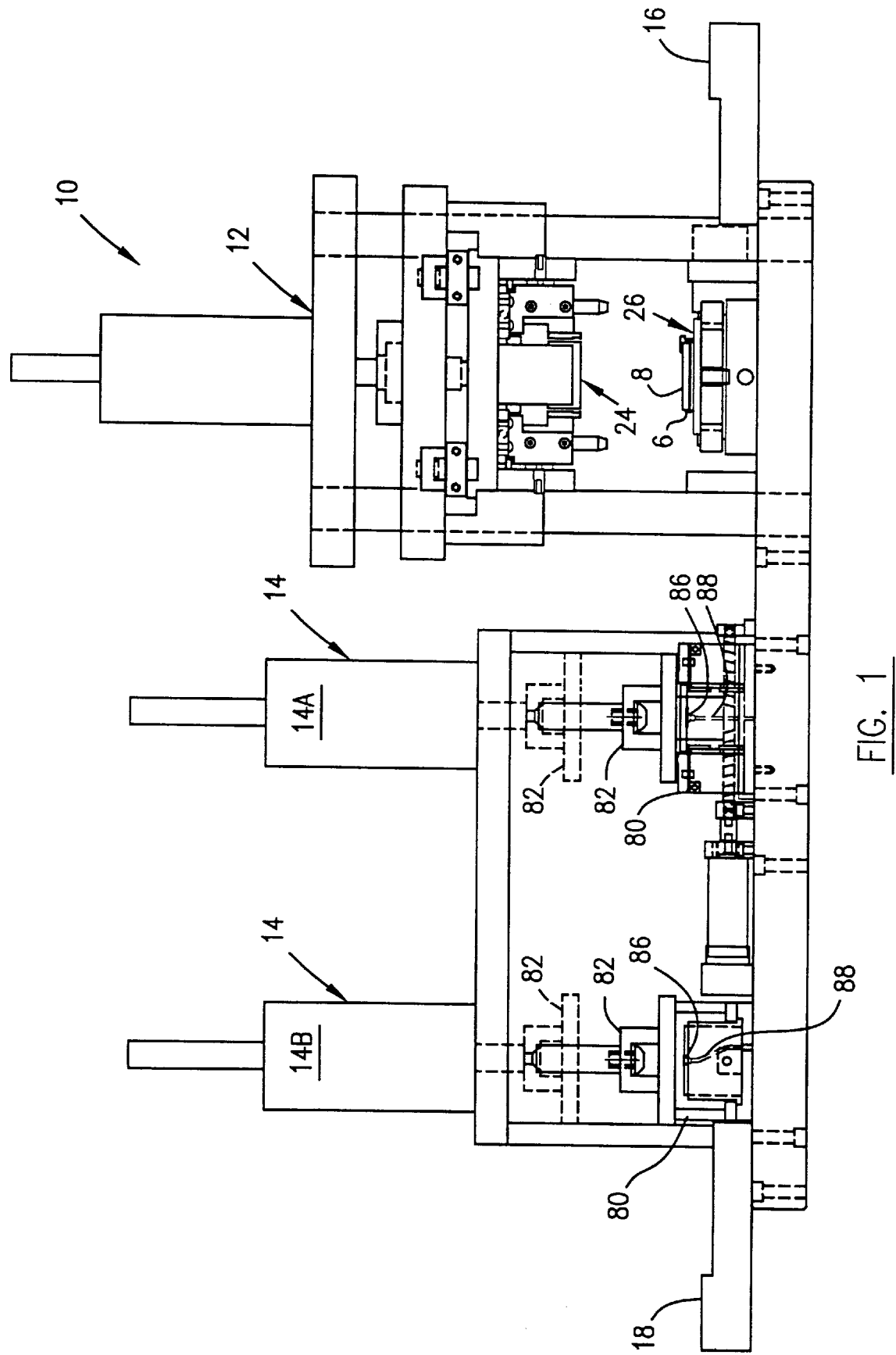
FIG. 1 is a front plan view showing a lead conditioning system in accordance with the present invention, shown with the engaging and massaging station in the open position and the forming stations in the closed position, shown with semiconductor devices positioned in the first and second stations.
Figure 2:
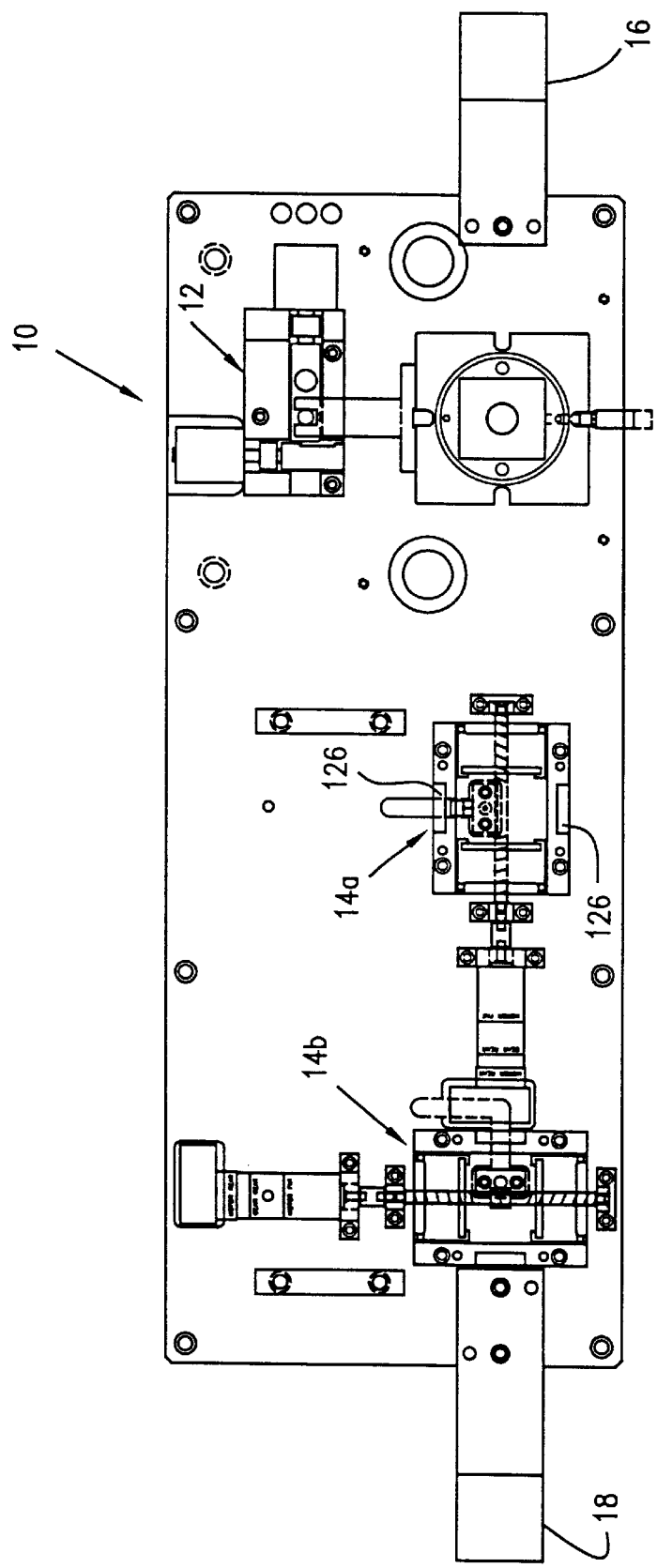
FIG. 2 is a top plan view, partially broken away, of the lead conditioning system of FIG. 1, shown with the semiconductor devices removed.

After the leads have been returned to a substantially parallel orientation, the semiconductor device 8 is transferred to the first forming station 14a. As is shown in FIGS. 6–12, the forming station includes a lower die or base 80 and an upper die 82. The base 80 includes two lead forming assemblies 84 positioned on opposite sides of the semiconductor device 8. The leads 6 are positioned on the adjacent lead forming assembly 84 such that the assemblies support the semiconductor device during operation of the station. As shown in FIGS. 1 and 2, a vacuum cup 86 coupled to a vacuum source (not shown) via conduit 88 is positioned to seal against the underside of the body of the semiconductor device to create a vacuum. A vacuum sensor (not shown) is triggered when the vacuum is created, sending a signal to the control system that the semiconductor device is accurately seated on the lead forming assemblies 84. Thus, as with the vacuum sensor 54 in the engaging and massaging station 12, the vacuum cup 86 and vacuum sensor prevent a misplaced part from being damaged. The vacuum cup and vacuum sensor may be replaced with other means for sensing the accurate placement of the semiconductor device on the lead forming assemblies 84.

In the illustrated embodiment, both forming stations 14*a* and 14*b* simultaneously form leads projecting from opposite sides of the molded body of the semiconductor device. Thus, each station 14*a* and 14*b* includes two lead forming assemblies 84 positioned on opposite sides of the package nest, with the lead forming assemblies 84 of station 14*b* being positioned to condition leads of different sides of the device 8 than the lead assemblies 84 of station 14*a*. Adapting each lead forming station 14*a*, 14*b* to simultaneously condition leads projecting from opposite sides of the semiconductor device is of particular advantage in that it provides a system which efficiently and rapidly conditions the leads of the semiconductor devices while being readily adjustable to accommodate semiconductor devices of different dimensions. However, it is to be understood that in other modifications of the invention the lead conditioning system 10 may include one lead forming station with a sufficient number of lead forming assemblies 84 to simultaneously condition all leads of the semiconductor device, or a greater number of lead forming stations each including only one lead forming assembly and a support member positioned to cooperate with the single assembly and support the semiconductor device during operation of the station.

Figure 8:
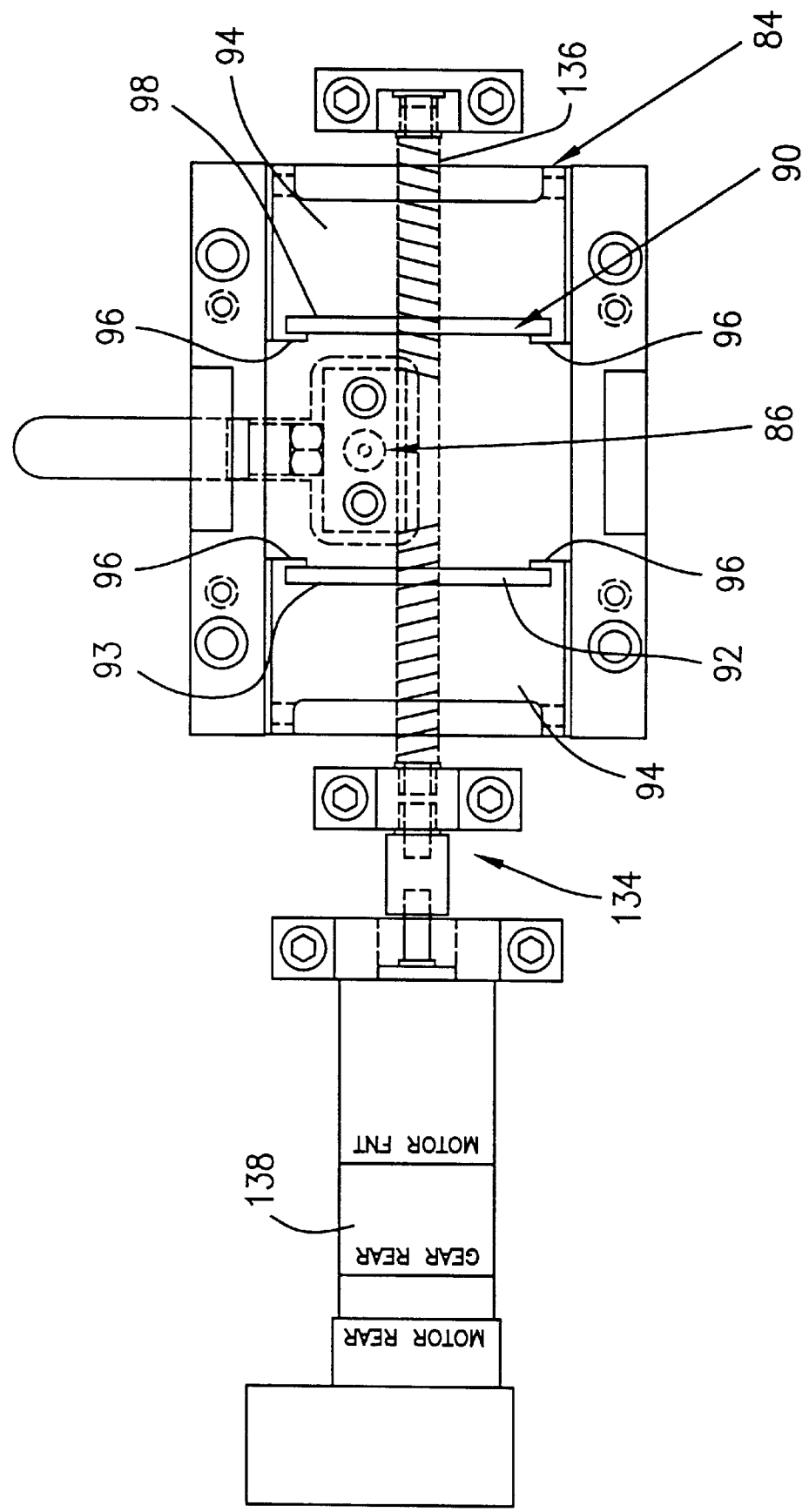
FIG. 8 is a top plan view, partially broken away, taken substantially along line 9—9 in FIG. 6.

Since the lead forming assemblies 84 of stations 14*a* and 14*b* are duplicates, only one lead forming assembly 84 will be described in detail, with this description applying equally to the other lead forming assemblies. Lead forming assembly 84 generally includes an anvil 90 and a forming arm 92 carried by a support 94. The support 94 includes a pair of inwardly directed flanges 96 forming a slot 98 in the support for receiving the anvil 90 as shown in FIG. 8. For clarity, the forming arms 92 have been omitted from FIG. 8. The anvil 90 is movable relative to the support 94, allowing for adjustment of the height of the anvil relative to the support 94 as is discussed below. The anvil may also be removed and replaced, allowing a number of different anvils to be used with in the forming assembly 84. In the present embodiment, lead forming assembly 84 includes a single anvil 90 as shown in FIG. 8 and a single forming arm 92. However, in other embodiments of the invention a greater number of anvils and/or forming arms may be employed.

The anvil 90 is provided with an anvil surface 100 which is configured to form the leads to a predetermined configuration. Turning to FIG. 9, anvil surface 100 includes a vertically extending stretch 100*a* which retains the leg 6*a* of the lead at the desired inclination, here shown substantially vertical, and a horizontally extending stretch 100*b* for which supports the foot 6*b* of the lead. The horizontally extending stretch 100*b* is conforms to the orientation of the foot 6*b* in the predetermined configuration. In the illustrated embodiment, the surface 100*b* is slanted downwardly-outwardly at a slight angle in the range of 2° to 6° and is suitable for re-forming leads with the lead foot having a similar inclination. The shape of the anvil surface 100 is subject to considerable variation depending upon the desired configuration for the leads 6. In this embodiment of the invention, the anvil 90 is provided with both stretches 100*a*, 100*b* of the anvil surface 100. Forming both stretches on the anvil 90 allows the anvil surface to be accurately and reliably formed and eliminates the requirement of aligning the two stretches. However, in other modifications of the invention the horizontally extending stretch may formed on the support 94 and only the vertically extending stretch provided by the anvil 90.

As discussed above, the anvil 90 is movable relative to the support 94. If the foot 6*b* of the leads and/or the bend at the shoulder 6*c* must be re-formed, retaining the anvil 98 in the position shown in FIG. 9 will provide sufficient support to re-form the leads. Moving the anvil 98 to the raised position shown in FIG. 11 is useful if support at the shoulder 6*c* is needed or if the stand-off distance (the distance between the underside of the molded body and the bottom of the foot 6*b*) or the tip-to-tip distance (the distance between the tips of leads projecting from opposite sides of the device) must be changed. As is shown in FIG. 10, the anvil 90 includes an upwardly-extending slot 102. A horizontally extending cam 104 through the slot 102 and support 94 and is coupled to a drive mechanism (not shown). The cam 104 is positioned to engage the upper surface 106 of the slot 102, which surface 106 is the cam follower. By rotating the cam 104, the anvil 90 be raised and lowered relative to the support 94. In other modifications of the invention, other means may be used to adjust the position of the anvil relative to the support. Instead of moving the anvil 90, the relative height of the anvil surface 100 may also be adjusted by inserting a different anvil into the support.

As is shown particularly in FIG. 9, the leads are urged against the anvil surface 100 by the forming arm 92 to form the leads 6 to the desired configuration. The forming arm 92 includes a forming surface, generally designated at 108 in FIG. 9, which engages or contacts the leads. In the illustrated embodiment of the invention, the forming surface 108 includes a generally curved first stretch 108*a* which engages the leg 6*a* of the lead, a curved second stretch 108*b* which engages the foot 6*b* of the lead, and a third stretch 108*c* extending between the stretches 108*a* and 108*b*. In the illustrated embodiment, the radius of curvature of the forming surface 108 where the stretch 108*c* joins the stretches 108*a* and 108*b*, respectively, is about 0.005 inch. As shown in FIG. 9A, the third stretch 108*c* typically does not contact the lead 6 although some contact may occur if a substantial amount of plating has accumulated in the bend of the lead. Eliminating or reducing contact between the lead 6 and forming arm 92 in the area of the third stretch is of particular advantage in that it eliminates flattening of the leads at this point if there is a substantial amount of material at the lead bend. It is to be understood that the forming surface 108 may have other configurations in accordance with the present invention. For example, the forming surface may include a curved corner between a vertically extending stretch and a horizontally extending stretch. With the configuration shown in FIG. 9 or a forming surface having a curved corner, the amount of force applied to the leads 6 by the forming arm 94 may be increased, allowing the leads to be rapidly re-formed to the desired configuration. The forming surface 108 may also have other shapes; for example, the surface 108 may be shaped complementary to the leg 6*a* and foot 6*b* of a lead in the predetermined configuration.

The forming arm 92 is pivotally coupled to the support 94 by pivot pin 110. The forming arm 92 pivots about the axis of pin 110 to raise and lower the forming surface 108 relative to the leads 6 and the anvil surface 100, moving the forming arm between an initial position shown particularly in FIG. 6 and a final position, with the forming surface 108 urging the leads against the anvil surface 100, shown particularly in FIGS. 7 and 9. Preferably, the lead forming assembly 84 includes means for biasing the forming arm 92 to the initial or raised position. One such biasing means is a spring 112 coupled to the forming arm 92 and the support 94. With the spring 112 positioned between the arm 92 and the support 94 as shown in FIG. 4, the spring also provides a degree of shock absorbance by resisting the downward movement of the forming arm 92. However, it is to be understood that other means may be used to bias the forming arm 92 to the initial position in accordance with the present invention.

Figure 6:
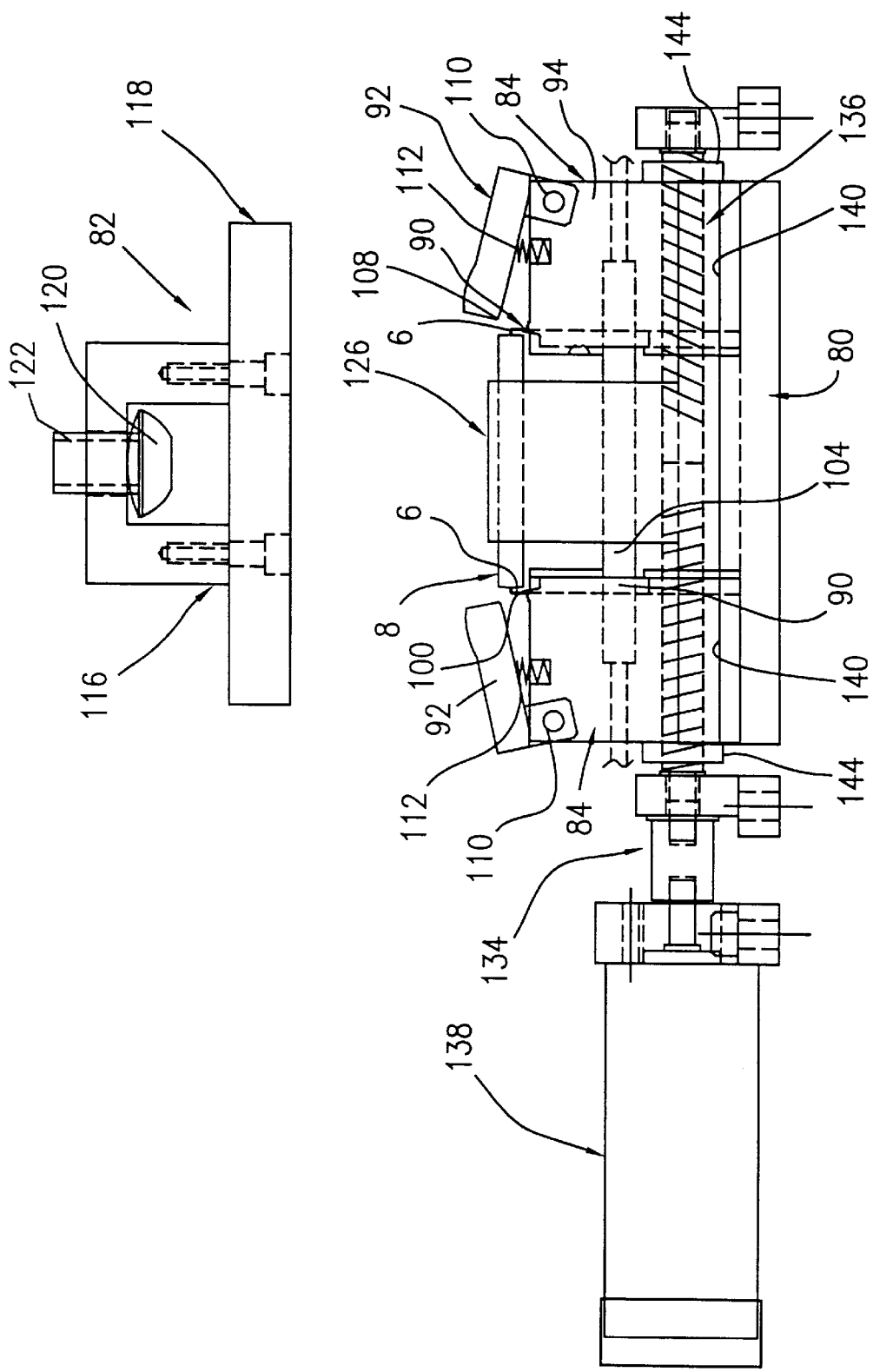
FIG. 6 is a front plan view, partially broken away, of the forming station of FIG. 1, shown in the open position with a semiconductor device positioned for treatment.
Figure 7:
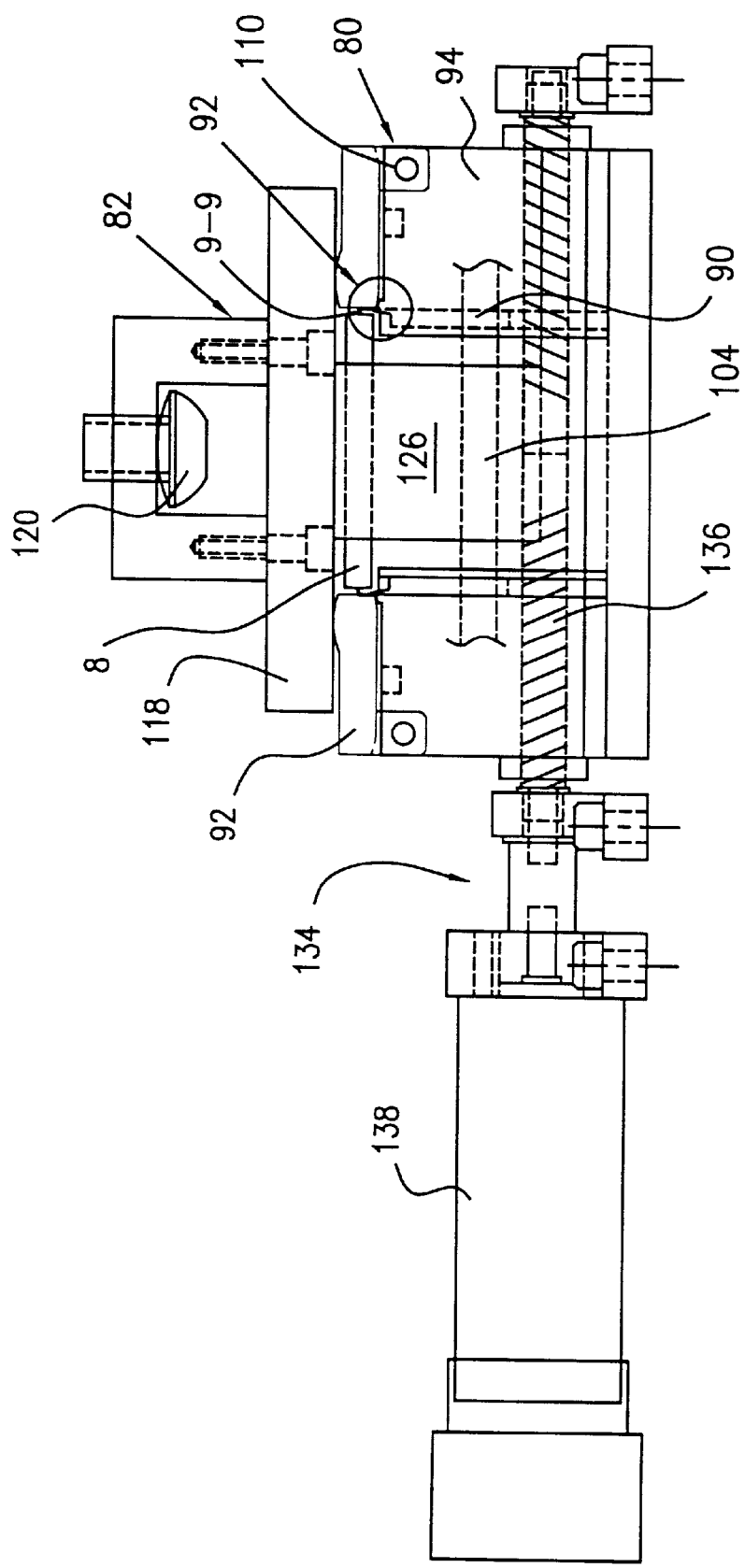
FIG. 7 is a front plan view, partially broken away, of the forming station of FIG. 6, shown in the closed position.

The forming arm 92 of each lead forming assembly is moved from the initial position shown in FIG. 6 to the final position shown in FIGS. 7 and 9 by an actuator 116. During operation of the station 14, the actuator is moved downwardly toward the support 94 to engage the forming arms 92 and pivot the arms 92 to the final position. In the illustrated embodiment, the actuator 116 includes a strike plate 118 adapted to engage the back surface of the forming arms 94 of both assemblies 84 and move the arms 94 to the final position. The strike plate 118 is mounted to a pivotal coupling such as universal bearing 120 carried by the actuator support 122 such that the strike plate 118 floats relative to the support 122. Thus, the strike plate 118 is self-aligning as the plate is allowed to pivot to accommodate variations in the vertical position of the forming arms 92, ensuring that a sufficient downward force is applied to each of the forming arms 92 during operation of the station 14.

The base 80 includes means to limit the downward movement of the strike plate 118 relative to the lead forming assemblies 84, preventing potential damage to the leads 6 of the semiconductor device. In the illustrated embodiment, the base 80 includes a pair of stops 126 between the lead forming assemblies 84 shown in FIGS. 2 and 8. The stops 126 are spaced outwardly of the side edges of the lead forming assemblies 84 to eliminate the risk of interference with the semiconductor device when the device 8 is positioned in the forming station. The height of the stops 126 relative to the anvil surface 100 is preferably selected so that when the strike plate 118 engages the stops 126, there is a gap between the forming surface 108 and the anvil surface 100 as shown in FIG. 12. Providing this gap ensures that the downward movement of the strike plate 118 is not limited by the leads themselves and also ensures that the forming surface 100 will not scrape the lead finish when the leads are re-formed. For a lead thickness in the range of 0.005 to 0.007 inches, the size of the gap is about 0.004 to 0.010 inches. Instead of stops 126, the base 80 may include a single stop or more than two stops. Moreover, it is to be understood that the lead forming station 14 may include other means for limiting downward movement of the strike plate 118 relative to the base 80 in accordance with this invention.

The lead forming assemblies 84 of the present invention are of particular advantage. The assemblies 84 include both the forming arms 92 and the anvil 90 used to re-form the leads to the desired configuration. The actuator 116 is not directly involved in re-shaping the leads. Instead, the sole function of the actuator 116 is to supply the force required to move the forming arms 92 relative to the anvil 90. With this arrangement, careful alignment of the reciprocal upper portion of the forming station and the base 80 is not required. The forming arm 108 and anvil surface 100 may be easily retained in precise alignment since movement between these two components is limited. Another advantage of coupling the anvil 90 and forming arm 92 together as a unit is that the position of these components relative to the semiconductor body may be easily and conveniently adjusted without requiring realignment of the forming surface 108 relative to the anvil surface 100.

With this invention, the lead forming station 14 may be easily and conveniently adjusted to accommodate different semiconductor devices as well as semiconductor devices of different sizes within a given tolerance range for the particular device. To precisely re-form the relative small leads to the desired configuration, it is important that the leads be accurately positioned relative to the anvil surface 100 and forming surface 108. The exact dimensions of the body of semiconductor devices from different manufacturers are often different, with the devices in each batch typically being of a substantially consistent size. Even small variations in the dimensions of the body of the semiconductor device within the defined tolerance range for the device may sufficiently shift the location of the leads relative to the center of the device body to require adjustment of the forming station to ensure the leads will be accurately reformed. With the lead conditioning system of this invention, the forming stations 14a and 14b may be conveniently and readily adjusted to accommodate the varying dimensions of different semiconductor devices. Since there is typically size uniformity within each batch, measurement of the device and adjustment of the forming station 14 is typically required only once—prior to the conditioning of the batch. However, it is to be understood that the conditioning system of the present invention is also suitable for applications where more frequent monitoring and adjustment may be required.

The forming station 14 of this invention further includes an adjustment mechanism, generally designated 134, for conveniently adjusting the lead forming station to accommodate semiconductor devices 8 of different sizes. In the illustrated embodiment, the adjustment mechanism 134 generally includes a lead screw 136 coupled to a servo-motor 138. The lead screw 136 extends through the slot 102 formed in the anvils 90 and is coupled to the supports 94 of the lead forming assemblies 84. The lead screw 136 extends through a lateral bore 140 formed in each support 94. A collar 144 threaded on the lead screw 136 engages the outer surface of each support 94 so that rotation of the lead screw 136 producing relative motion of the supports 94. The two halves of the lead screw 136 are provided with reverse threads so that when the lead screw 136 is rotated, the supports 94 are moved in opposite directions relative to one another to selectively bring the supports 94 closer together or to move the supports 94 farther apart.

The servo motor 138 is coupled to the control system, with the control system controlling actuation of the servo motor 138 to adjust the relative positions of the supports 94, and therefore the anvils 90 and forming arms 92, once a sample semiconductor device has been measured. It is to be understood that other activating devices may be used to adjust the lead screw 136 and move the lead forming assemblies 84. For example, a micrometer or other manual actuator may be used to move the lead screw 136.

The adjustment mechanism 134 of the illustrated embodiment is of particular advantage in that the positions of two lead forming assemblies 84 may be conveniently and efficiently adjusted to selectively increase or decrease the spacing between the anvil surfaces 100 to accommodate a specific semiconductor device. The mechanism includes a minimum number of parts, reducing manufacturing costs as well as the amount of maintenance required. Thus, the lead forming assemblies 84 and the adjustment mechanism 134 provide the lead forming station 14 with considerable flexibility together with the efficiency obtained by simultaneously conditioning the leads projecting from two sides of the semiconductor device. If desired, the lead forming station may include four lead forming assemblies 84 instead of two each positioned on one side of a semiconductor device, with the opposite pairs of lead forming assemblies each being coupled together by an adjustment mechanism. In this arrangement, the lead screw of one adjustment mechanism would be vertically spaced from the lead screw of the other mechanism.

Figure 13:
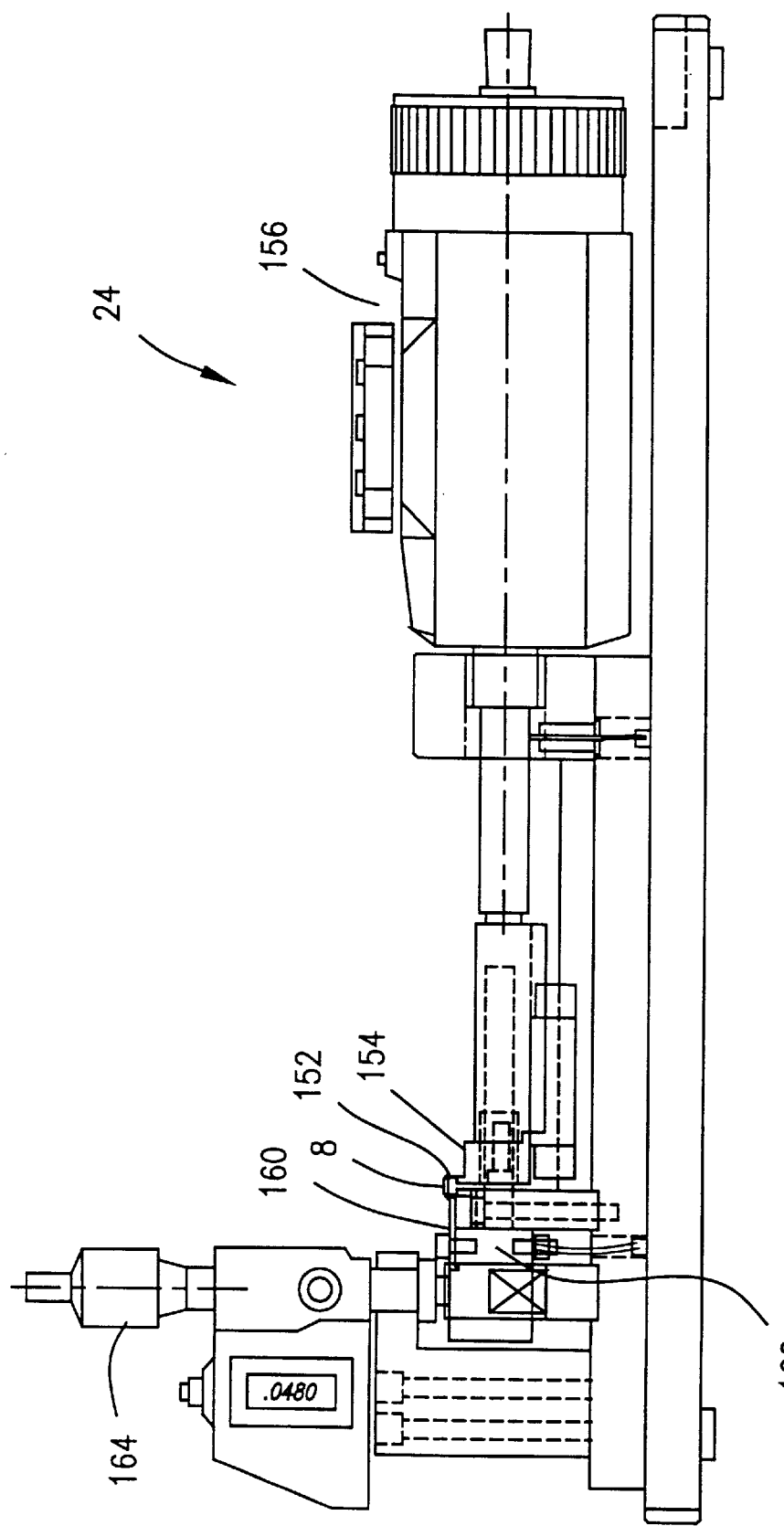
FIG. 13 is a front plan view of a calibration device in accordance with the present invention.
Figure 14:
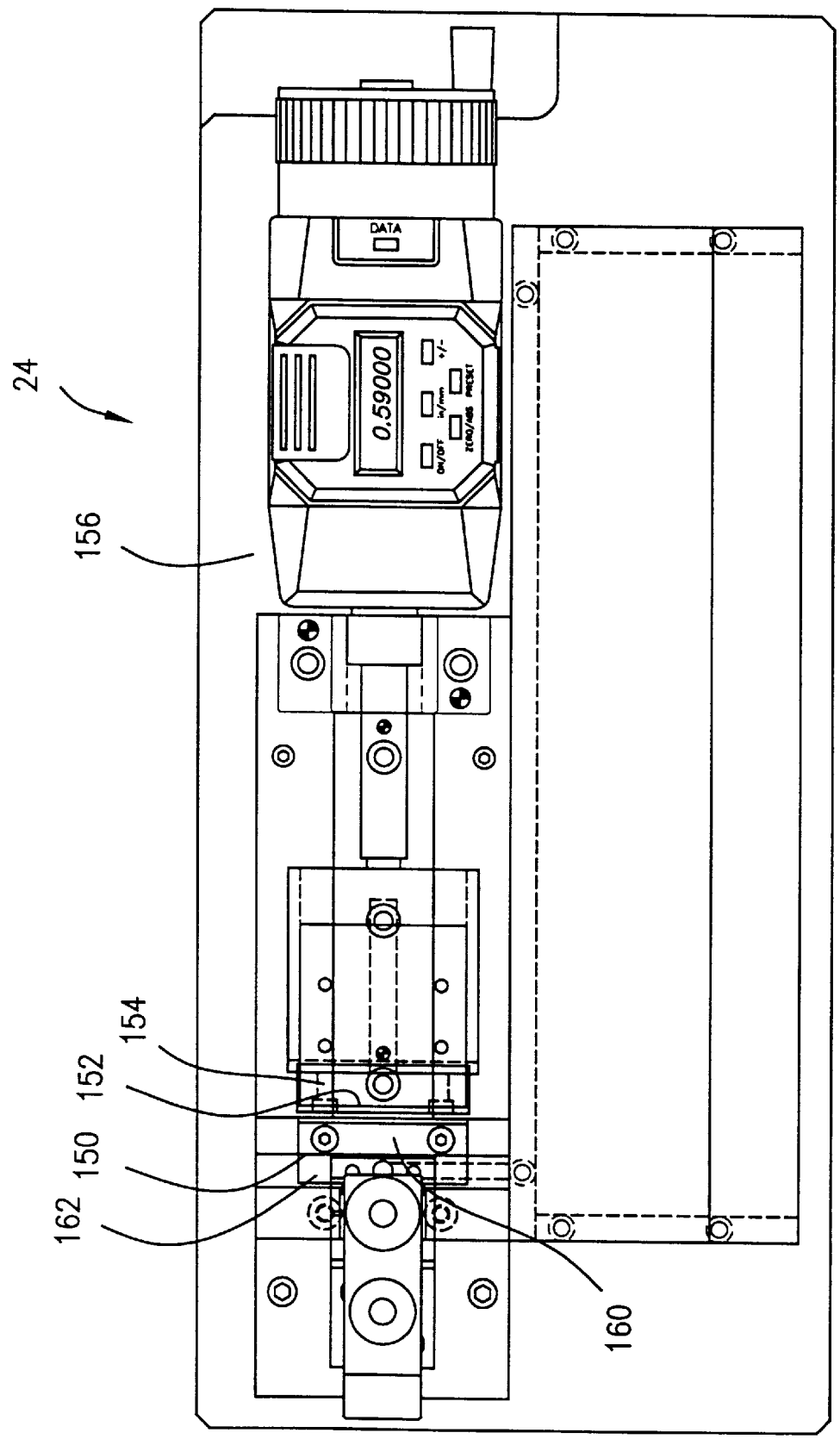
FIG. 14 is a top plan view of the calibration device of FIG. 13.
Figure 15:
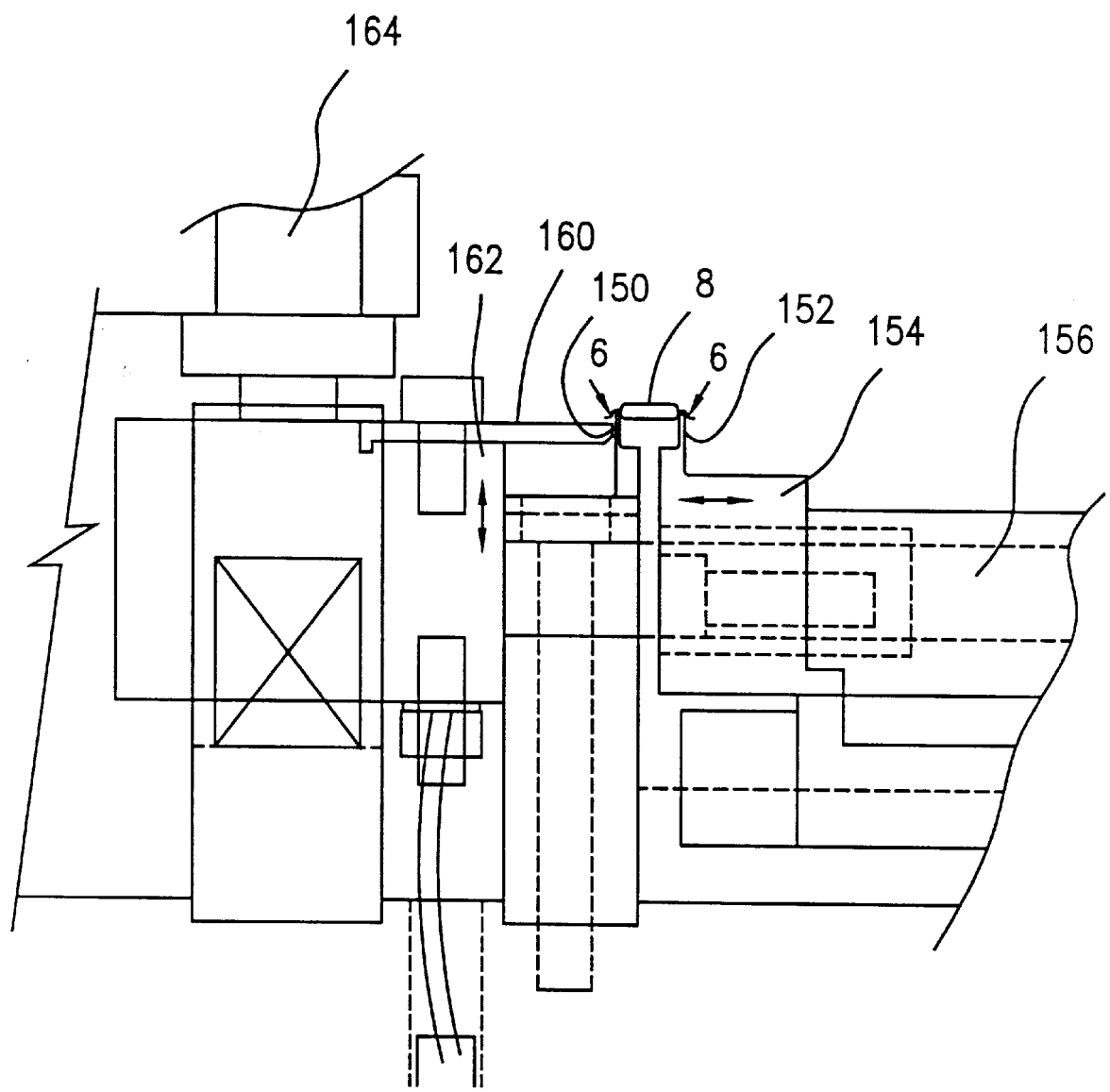
FIG. 15 is an enlarged, front plan view, partially broken away, of the calibration device of FIG. 13.

The calibration station 24 of the present invention is shown particularly in FIGS. 13–15. The station may be used to measure sample semiconductor devices 8 to determine whether any adjustment of the engaging and massaging station 12 and/or of the forming station 14 is required. First, the original height of the leg 6a of the semiconductor device 8 is measurement to determine whether the height of the support 30 needs adjustment to obtain the desired amount of push out of the leads relative to the molded body of the semiconductor device when the support 30 is moved downwardly relative to the lead sweep plate 36. Once the leg height is measured, the actuator 59 may be manipulated to make the required adjustment to the lower block 57. Preferably, the calibration device and actuator are cooperatively calibrated so that the blocks may be adjusted by dialing or moving the actuator 59 to the number indicated on the calibration device. Another measurement which is obtained using the calibration station 24 is the shoulder-to-shoulder distance or the distance between the center line of the bend radius for shoulders 6c on opposite sides of the semiconductor device. This measurement may be used to identify the location of the leg 6a and foot 6b of the leads or the portions of the leads to be re-formed by the anvil surface 100 and the forming surface 108. The shoulder-to-shoulder measurement is input into the control system, which compares the measurement with the current position of the lead forming assemblies 84 and, if necessary, activates the servo motor 138 to adjust the spacing between the lead forming assemblies 84.

As is shown particularly in FIG. 15, the semiconductor device is seated on a pair of spaced vertical blades 150 and 152 which are inserted between the molded body of the device 8 and the leg of the lead 6a. In addition to supporting the device 8, the blades 150 and 152 are used to measure the shoulder-to-shoulder distance of the device to determine the relative placement of the lead forming assemblies 84 for conditioning this device. The blade 152 is carried by a reciprocal block 154 which is urged in the opposite direction of blade 150 by a spring. A micrometer 156 engages the block 154, limiting the movement of the blade 150. Once the device 8 is positioned on the blades 150 and 152, the block 154 is moved away from the device by activating the micrometer 156 until the blade 152 engages the shoulders 6c (FIG. 9) of the leads and, if necessary, pulls the device to move the shoulders of the opposite leads into engagement with the blade 150. Further movement of the blade 152 is resisted by the engagement between the leads and the blade 150. Once this resistance is detected, operation of the micrometer 156 is discontinued. The reading provided by the micrometer 156 is input into the control system, which compares the reading with the current position of the lead forming assemblies 84 and, if necessary, activates the adjustment mechanism 134 to adjust the spacing between the assemblies 84 so that the leads will be accurately positioned on the anvil surfaces.

A lead contact plate 160 is positioned adjacent the stationary blade 150. The lead contact plate is carried by a reciprocal block 162 which moves the plate 160 in an upward and downward direction relative to the device. The block 162 is urged upwardly by a spring, with a micrometer 164 resisting the upward movement of the micrometer. Before the device is positioned on the blades 150 and 152, the block 162 is lowered to move the lead contact plate 150 away from the leads so that the plate 160 will not interfere with the shoulder-to-shoulder measurement. The contact plate 160 is raised by activating the micrometer, with the plate 160 being moved upwardly until it contacts the feet of the leads. Once the lead contact plate is moved to a position where it contacts the leads with the blades 150 and 152 both supporting the device, the reading on the micrometer 164 is compared with the reading on the actuator 59 of the engaging and massaging station. If necessary, the actuator 59 is adjusted to conform to the reading of micrometer 164.

It is to be understood that the configuration of the calibration station 24 is not to be limited to the embodiment shown in FIGS. 13–15. Instead of manual micrometers 156 and 164, other means may be used to adjust the position of the blade 152 and the lead contact plate 160. If desired, the movement of the blade 152 and lead contact plate 160 may be controlled automatically, and the calibration station 24 coupled to the control system.

The following description describes the operation of the lead conditioning system. Prior to initiating operation of the lead conditioning system 10 of this invention, one or more sample devices are selected from a batch of semiconductor devices having leads requiring conditioning. The sample devices are measured to identify the height of the leg of the lead and relative position of the shaped portions of the lead—in the illustrated application of the invention the leg and foot of the lead. The engaging and massaging station 12 is adjusted by activating actuator 59, while the lead forming stations are automatically adjusted by the control system once the measured information is input into the control system.

The batch of semiconductor devices 8 are supplied to the starting point 16 as is known in the art. The part handling shuttle delivers a first semiconductor device to the package nest 30 of the engaging and massaging station 12. Once the accurate placement of the semiconductor device is detected, the upper die is closed onto the lower die, with the pressure pin 76 lowering the package nest to bend the leads upwardly relative to the device body. With the leads in this condition, the air cylinders extend and retract, moving pivot arm 40 to massage the leads and return the leads to a substantially parallel orientation. The upper die is opened, raising the comb from between the leads and releasing the package nest 30 from the lowered position.

The part handling device transfers the first semiconductor device from the package nest 30 of the engaging and massaging station 12 to the package nest 82 of the first lead forming station 14a, while simultaneously transferring a second semiconductor device 8 from the starting point 16 to the engaging and massaging station 12. Once the accurate placement of the semiconductor devices in the package nest 30 and on the lead forming assemblies 84 is detected, the actuator 116 is lowered against the base 80 moving the forming arms 92 to the final position to urge the leads against the anvil 90, reforming the leads projecting from two sides of the semiconductor device. The actuator 116 is then raised. Operation of the engaging and massaging station 12 occurs simultaneously with that of the first lead forming station 14a.

The first semiconductor device 8 is then moved from the first lead forming station 14a to the second lead forming station 14b, the second device 8 is moved from the engaging and massaging station 12 to the first lead forming station 14a, and a third semiconductor device is moved from the starting point 16 to the engaging and massaging station 12. In the illustrated embodiment, the lead forming station 14b is identical to the lead forming station 14a except that the station 14b is rotated 90° relative to the station 14a. Thus, rotation of the semiconductor device as it travels from station 14a to station 14b is not required. Operation of the second lead forming station 14b is identical to that of the first lead forming station to re-form the leads projecting from the other two sides of the semiconductor device. After the actuators 116 of the lead forming stations 14 and the upper die 26 of the engaging and massaging station 12 are raised, the part handling shuttle 20 transfers the first device to the finished point 18 and moves each successive semiconductor device forwardly through the conditioning system 10.

Rather than manually measuring selected good sample devices from a batch of semiconductor devices being conditioned, the sample devices can be scanned with a high speed 3D digital camera, and the camera output processed by a processor. The output of the processor is applied to servo drives which position the support 30, for lead straightening (station 12), and the lead forming assemblies 84 and 89 (station 14) for the selected device. The conditioned devices then will have the same dimensions as the selected good sample device. For a better understanding of the operation of the automatic positioning or adjustment system, reference is made to FIGS. 16 and 17.

Figure 16:
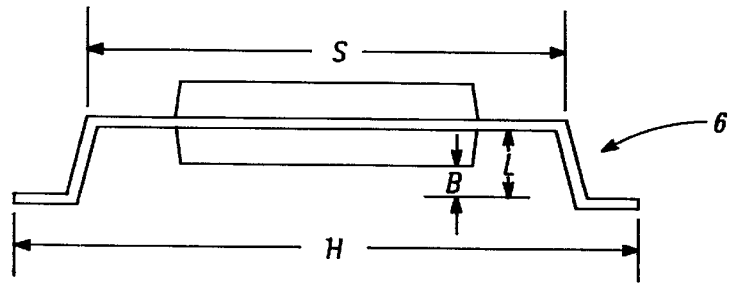
FIG. 16 shows a typical semiconductor device and the critical lead dimensions for understanding the present invention.

A typical encapsulated semiconductor device is shown in FIG. 16 with outwardly and downwardly extending leads 6. One of the important dimensions is the stand-off distance B between the bottom of the package and the foot of the leads. This is the dimension which must be maintained for the lead straightening operation associated with station 12. The other important dimensions are the distance S between the lead bends on opposite sides of the package, the vertical length L of the leg, and the terminal dimension H of the package. These are needed in the lead forming operation, stations 14.

Figure 17:
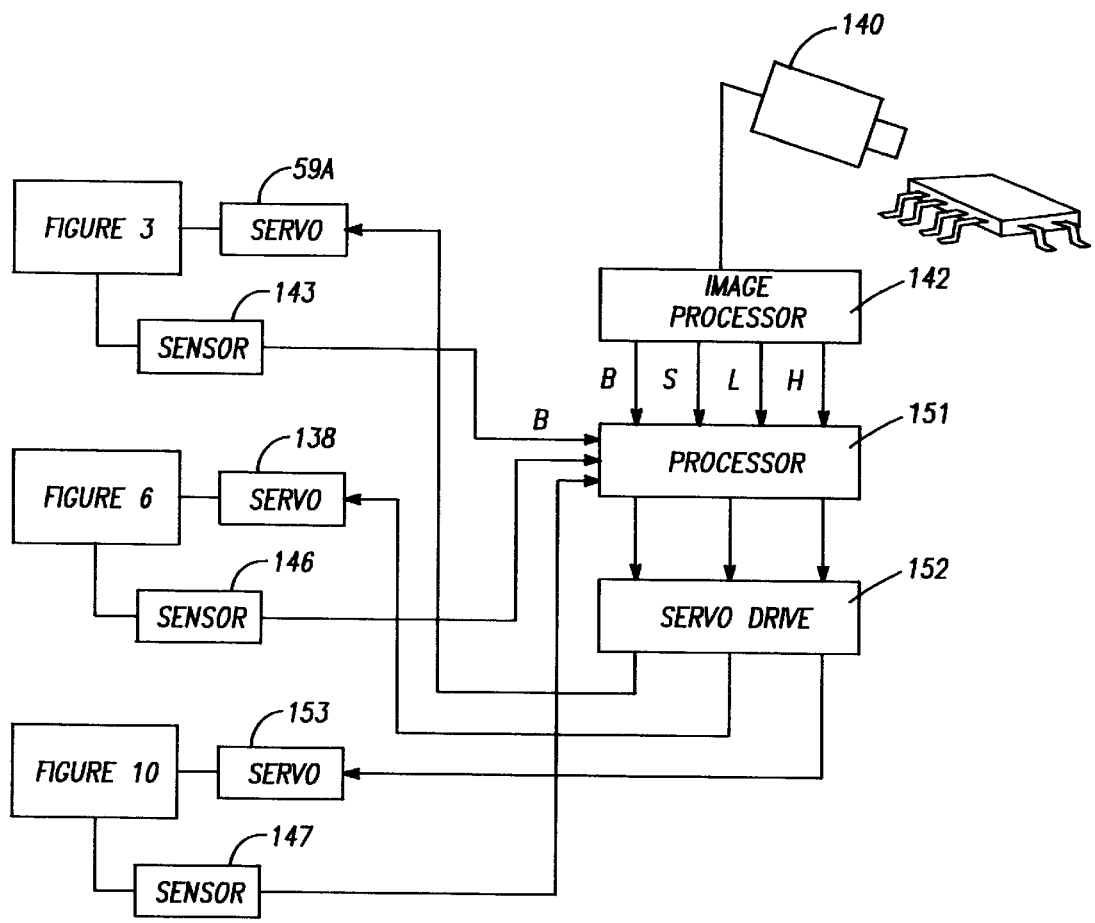
FIG. 17 is a schematic diagram of a scanner and control system for automatically setting the dimensions of the lead conditioning apparatus.

Referring to FIG. 17, the output frame signals from the digital camera 140 are processed by image processor 142 to provide output signals corresponding to the dimensions B, S, L and H.

The lead conditioning stations 12 and 14 are provided with suitable sensors which give an indication of the position of the lead conditioning elements. A sensor 143 associated with station 12 provides an output signal representative of the position of the nest or support 30 which determines the dimension B. Similarly, the sensors 146 and 147 provide outputs which represent the dimensions S and L, at which the anvil 90 and the forming assemblies 84 are set. The output signals B, S and L are applied to a processor 151.

As previously discussed, the output signals from the 3D digital camera 140 are processed by processor 142 which provides output dimension signals representing the distances B, S, L and H for devices selected from a batch of semiconductor devices having leads requiring conditioning. The signals are applied to the processor 151 which compares the dimensions B, S and L from sensors 143, 146 and 147, representing the positions of the conditioning system components to the desired position to achieve the dimensions B, S, L and H for the devices requiring conditioning. The processor 151 generates position signals corresponding to the difference between the actual position and the desired position. The position signals are applied to a servo control 152 which drives servo motor 59A which replaces micrometer 59 associated with the support 30, servo motor 138 associated with the lead forming assembly 84, and the servo motor 153, not shown in FIG. 10, which drives the cam 104 associated with the anvil 90. When the signals from the sensors match the desired signals from the semiconductor device to be processed, the nest or support 30, anvil 90 and forming assembly 84 are in position, and the lead conditioning system is activated.

In the alternative, if, rather than batches of semiconductor devices having leads requiring conditioning are being processed, single mixed devices are to be processed, the processing equipment can be continuously operated to adjust the position of the various system components for each device being processed.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. An apparatus for conditioning the leads projecting from the body of a semiconductor device comprising:

a base for supporting the body of the semiconductor device, said base including first and second support members, anvil surfaces configured to form the leads to a predetermined shape carried by said support members on opposite sides of said base, a forming arm mounted on each of said support members associated with each of said anvil surfaces, said forming arms being pivotal between a first position with said forming arms spaced from the leads and a second position with said forming arms urging the leads against said anvil surfaces to form the leads to predetermined shape, an actuator movable relative to said base, said actuator engaging said forming arm when said actuator is moved toward said base to move said forming arm from the first position to the second position to urge the leads against said anvil surface, and form the leads to the predetermined shape, means for moving at least one of said support members relative to the other of said support members to adjust the relative position of said forming arms and said anvil surfaces, sensor means for generating a position signal representative of the relative position of said forming arms and said anvil surfaces, means for scanning sample semiconductor devices and generating dimension signals representative of the lead dimensions of said sample semiconductor device, and processing means for receiving said dimension signals and said sensor signal and generating positioning signals, and applying said positioning signals to said means for moving said at least one support member relative to the other to condition the leads of a semiconductor device to the dimensions and configuration of said sample semiconductor devices.

2. The apparatus of claim 1 including sensor means for generating a signal representative of the position of the anvil surface relative to the base, said processing means additionally receiving said sensor signal and generating an anvil surface positioning signal, and means responsive to said anvil surface positioning signal for moving said anvil surfaces relative to said base to adjust the height of said anvil surfaces relative to the base.

3. A lead conditioning apparatus as in claim 2 further including a lead engaging and massaging station having at least one comb to engage the leads of said semiconductor device and reintroducing a predetermined spacing between the leads to bring the leads into parallelism, a support for retaining said semiconductor device, means for selectively raising and lowering said support, and means for receiving a position signal and adjusting the position of said support.

* * * * *